United States Patent
Liu et al.

(10) Patent No.: US 9,013,892 B2
(45) Date of Patent: Apr. 21, 2015

(54) CHIP STACKING STRUCTURE

(71) Applicant: Industrial Technology Research Institute, Hsinchu (TW)

(72) Inventors: Chang-Chih Liu, Taichung (TW); Hsun Yu, Hsinchu County (TW); Peng-Shu Chen, New Taipei (TW); Shih-Hsien Wu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 180 days.

(21) Appl. No.: 13/912,207

(22) Filed: Jun. 7, 2013

(65) Prior Publication Data

US 2014/0177189 A1    Jun. 26, 2014

(30) Foreign Application Priority Data

Dec. 25, 2012  (TW) .............................. 101149886 A

(51) Int. Cl.
*H05K 7/00*      (2006.01)
*H01L 25/00*     (2006.01)
(Continued)

(52) U.S. Cl.
CPC .......... *H01L 25/00* (2013.01); *H01L 23/49822* (2013.01); *H01L 23/49833* (2013.01); *H01L 23/5223* (2013.01); *H01L 23/5227* (2013.01)

(58) Field of Classification Search
CPC ................... H01L 23/49822; H01L 23/49833; H01L 23/5223; H01L 23/5227; H01L 25/00
USPC .................. 361/790, 784, 760, 766, 728, 735
See application file for complete search history.

(56) References Cited

U.S. PATENT DOCUMENTS

| 6,417,754 | B1 | 7/2002 | Bernhardt et al. |
| 6,875,921 | B1 | 4/2005 | Conn |
| 6,972,081 | B2 | 12/2005 | Wong |

(Continued)

FOREIGN PATENT DOCUMENTS

| KR | 20120054665 | 5/2012 |
| TW | 200924278 | 6/2009 |

(Continued)

OTHER PUBLICATIONS

Tanabe et al., "A Low-Power, Small Area Quadrature LC-VCO using miniature 3D Solenoid shaped Inductor", IEEE Radio Frequency Integrated Circuits Symposium, Jun. 2009, p. 263-p. 266.

(Continued)

*Primary Examiner* — Yuriy Semenenko
(74) *Attorney, Agent, or Firm* — Jianq Chyun IP Office

(57) ABSTRACT

A chip stacking structure including a plurality of microbump structures, a plurality of first substrates, at least one first space layer, a plurality of second substrates and at least one second space layer is provided. The first substrates are stacked upon each other by a portion of the microbump structures, and each of the first substrates includes at least one first redistribution layer. The first space layer is located between the stacked first substrates. The second substrates are stacked on at least one of the first substrates by another portion of the microbump structures, and each of the second substrates includes at least one second redistribution layer. The second space layer is located between the stacked first and second substrates. The first redistribution layers, the second redistribution layers and the microbump structures form a plurality of impedance elements, and the impedance elements provide a specific oscillation frequency.

17 Claims, 8 Drawing Sheets

(51) Int. Cl.
*H01L 23/498* (2006.01)
*H01L 23/522* (2006.01)

(56) References Cited

U.S. PATENT DOCUMENTS

| | | | |
|---|---|---|---|
| 7,049,692 | B2 | 5/2006 | Nishimura et al. |
| 7,355,264 | B2 | 4/2008 | Degani et al. |
| 2008/0001698 | A1* | 1/2008 | Hazucha et al. .............. 336/200 |
| 2008/0191293 | A1 | 8/2008 | Liu et al. |
| 2010/0026368 | A1 | 2/2010 | Tang et al. |
| 2010/0059855 | A1 | 3/2010 | Liu et al. |
| 2010/0117767 | A1 | 5/2010 | Liu |
| 2010/0225436 | A1* | 9/2010 | Papavasiliou et al. ........ 336/200 |
| 2010/0265009 | A1* | 10/2010 | Horng et al. .................. 333/185 |
| 2011/0170231 | A1 | 7/2011 | Chandrasekaran et al. |
| 2011/0317387 | A1* | 12/2011 | Pan et al. ...................... 361/782 |
| 2014/0027880 | A1* | 1/2014 | Duevel et al. ................. 257/531 |
| 2014/0319652 | A1* | 10/2014 | Lee et al. ...................... 257/531 |

FOREIGN PATENT DOCUMENTS

| | | |
|---|---|---|
| TW | 201037543 | 10/2010 |
| TW | 201209987 | 3/2012 |

OTHER PUBLICATIONS

Wu et al., "Co-Design and Modeling of Novel Packaging Interposer with IPD Layers", Proceedings of Asia-Pacific Microwave Conference, Dec. 2010 , p. 1216-p. 1219.

Tesson et al., "High Efficiency Embedded Decoupling Capacitors For MCM Applications", 38th European Solid-State Device Research Conference, Sep. 2008, p. 262-p. 265.

Prashant et al., "Integrated passive devices (IPD) integration with eWLB (Embedded Wafer Level BGA) for high performance RF applications", 12th Electronics Packaging Technology Conference, Dec. 2010, p. 677-p. 680.

Wu et al., "Analysis and application of miniature 3D inductor ", IEEE International Symposium on Circuits and Systems, May 2002, vol. 2, p. II-811-p. II-814.

"Office Action of Taiwan Counterpart Application", issued on Oct. 7, 2014, p. 1-p. 4, in which the listed references were cited.

* cited by examiner

CHIP STACKING STRUCTURE

CROSS-REFERENCE TO RELATED APPLICATION

This application claims the priority benefit of Taiwan application serial no. 101149886, filed on Dec. 25, 2012. The entirety of the above-mentioned patent application is hereby incorporated by reference herein and made a part of this specification.

TECHNICAL FIELD

The disclosure relates to a three-dimensional chip stacking structure.

BACKGROUND

In recent years, the electronic industry develops and prospers under the guidance of Moore's Law. However, with the increasing demand for higher computing speed of electronic products, technical challenges gradually emerge. In order to improve the performance of electronic products to meet the demand, the Three-dimensional integrated circuit integration (3D IC integration) technology has been proposed as one of the solutions for the current issues being encountered. The 3D IC integration technology is preferable as compared with the conventional package technology, for instance, small-sized, less signal loss and higher electrical performance, all of which are due to the utilization of a through silicon via (TSV).

The TSV and the microbump structures have become the major cores in the 3D IC integration technology. In a three-dimensional integrated circuit system in package (3D IC SiP) structure with a typical TSV interposer, the TSV interposer is capable of carrying chips above and below by utilizing the microbump structures and connecting to a substrate or a printed circuit board (PCB) via a solder bump structure. Thus, the 3D IC integration technology is one of the most effective structures for enhancing the performance of electrical products, allows a plurality of chips to interconnect with one another and integrates more computing capability, memory, and other functions in a same small device.

SUMMARY

Accordingly, the disclosure provides a chip stacking structure which includes a plurality of microbump structures, a plurality of first substrates, at least one first space layer, a plurality of second substrates and at least one second space layer. The first substrates are stacked upon each other by a first part of the microbump structures, and each of the first substrates includes at least one first redistribution layer. The first space layer is located between the first substrates. The first part of the microbump structures is disposed in the first space layer, and is configured to connect the first redistribution layer of the stacked first substrates. The second substrates are stacked on at least one of the first substrates by a second part of the microbump structures, and each of the second substrates includes at least one second redistribution layer. The second space layer is located between the first substrates and the second substrates. The second part of the microbump structures is disposed in the second space layer, and is configured to connect the first redistribution layer of the stacked first substrates and the second redistribution layer of the stacked second substrates. The first redistribution layers, the second redistribution layers and the microbump structures form a plurality of impedance elements, and the impedance elements provide a specific oscillation frequency.

To recapitulate, the chip stacking structure of the disclosure includes the plurality of three-dimensional winding impedance elements formed by the microbump structures, the conductive vias and the chips stacked in layers, in which the impedance elements are electrically connected to each other so as to maintain fine electrical properties.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
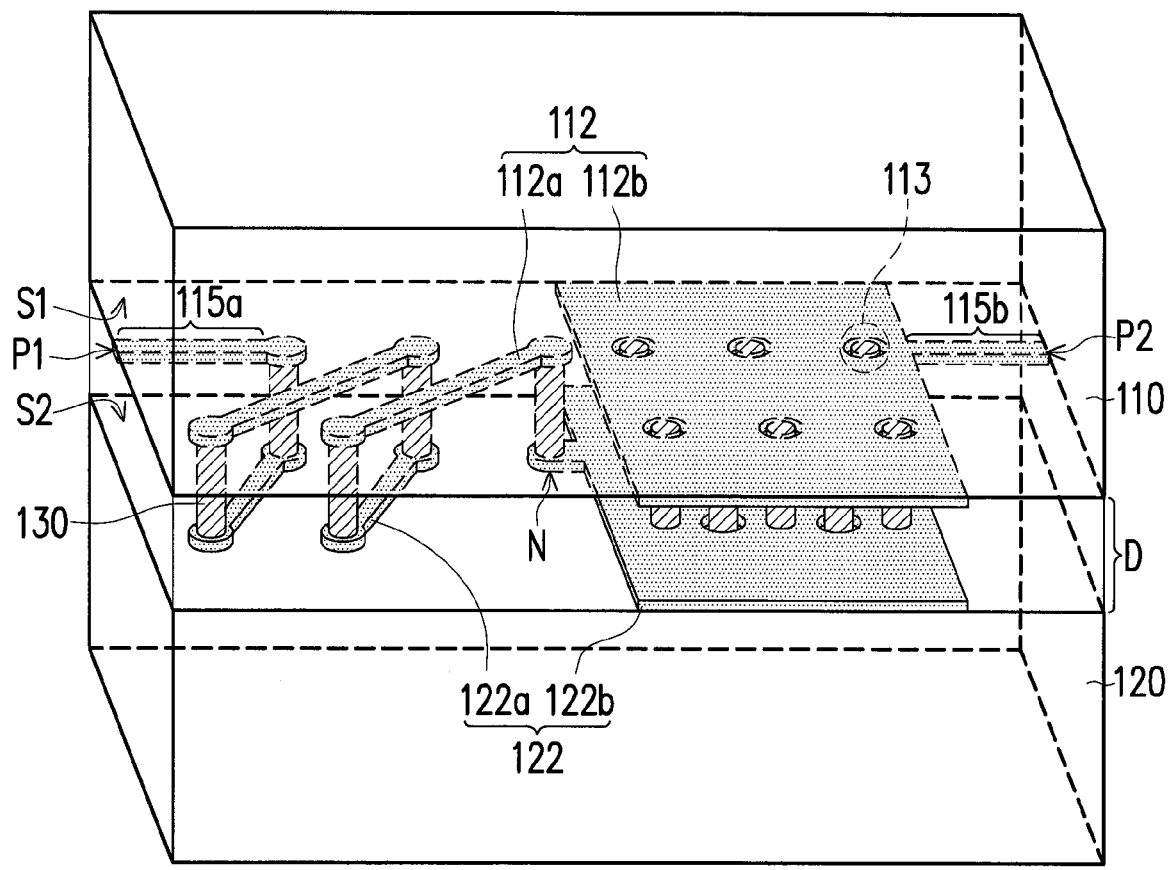
FIG. 1 is a schematic diagram illustrating a chip stacking structure according to an embodiment of the disclosure.

A passive electronic element is a major constituent element in a radio-frequency (RF) circuit. At present, most handheld wireless devices such as smart phones and tablet PCs include a large number of passive elements. Since the handheld wireless devices are light, slim, compact and convenient to be carried, how to reduce the size of circuits without affecting the performance of the system has become one of the research aspects to people having ordinary skill in the pertinent field. Currently, along with the rapid development of technologies in the 3D IC integration, the objective is to achieve multiple functions under the small space demand. In the disclosure, the 3D IC integration technology is employed to implement the electronic circuits having the passive electronic elements. Below, exemplary embodiments will be described in detail with reference to accompanying drawings so as to clearly illustrate the disclosure and to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
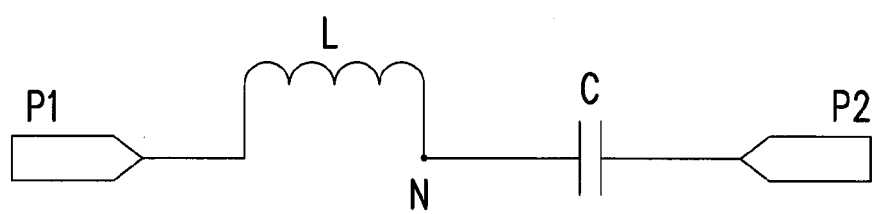
FIG. 2 is an equivalent circuit diagram illustrating the chip stacking structure depicted in FIG. 1.

FIG. 1 is a schematic diagram illustrating a chip stacking structure according to an embodiment of the disclosure. FIG. 2 is an equivalent circuit diagram illustrating the chip stacking structure depicted in FIG. 1. Referring to FIG. 1 and FIG. 2 together, the chip stacking structure 100 of the embodiment includes a plurality of first substrates 110, 120 and a plurality of microbump structures 130. The first substrates 110 and 120 include the first redistribution layers 112 and 122, respectively. The first redistribution layer 112 of the first substrate 110 is disposed on a bottom surface S1 of the first substrate 110, and the first redistribution layer 122 of the first substrate 120 is disposed on a top surface S2 of the first substrate 120. The microbump structures 130 are connected to the first redistribution layers 112 and 122, so that the first substrate 110 is stably bonded to the top surface S2 of the first substrate 120, thereby enhancing the structural strength of the chip stacking structure 100. Moreover, the first substrates 110 and 120 are electrically connected to each other via the first redistribution layers 112, 122 and the microbump structures 130, so as to transmit electrical signals. In the embodiment, the first redistribution layers 112, 122 and the microbump structures 130 form a plurality of impedance elements which include a capacitance element and an inductance element, and the combination of the impedance elements provides a specific oscillation frequency. Moreover, the materials of the first redistribution layers 112, 122 and the microbump structures 130 may be selected from gold (Au), copper (Cu), nickel (Ni), silver (Ag), and a combination thereof.

Specifically, in the embodiment, the first substrate 110 can be an interposer and the first substrate 120 can be a chip layer, for instance. There is a space layer D between the two first substrates. The space layer D may be filled with air or inert gas. When the space layer D is filled with inter gas, the first redistribution layers 112, 122 and the microbump structures 130 are not prone to be oxidized, and an operation of the chip stacking structure 100 remains smooth. Moreover, the space layer D may be filled with an insulating underfill to enhance the structural strength of the chip stacking structure 100. Under the implementation of capacitance structure, the insulating underfill may be further served as the dielectric material for the capacitance element. In the embodiment, the impedance elements include an inductance structure located in the left-hand side of the space layer D and a capacitance structure located in the right-hand side of the space layer D, in which the two structures may be implemented specifically as a set of the inductance element L and the capacitance element C connected in series on the circuit, as shown in FIG. 2. The set of impedance elements under the series configuration is capable of providing a specific oscillation frequency according to the setting of an inductance and a capacitance.

In the inductance structure located in the left-hand side of the space layer D, the first redistribution layer 112a disposed on the bottom surface S1 of the first substrate 110 is utilized to serve as the redistribution layer for the top layer of the inductance structure, and the first redistribution layer 122a disposed on the top surface S2 of the first substrate 120 is utilized to serve as the redistribution layer for the bottom layer of the inductance structure. Additionally, the microbump structures 130 are electrically connected to the redistribution layers for the top and bottom layers of the inductance structure, so as to form a helical inductance structure. The inductance structure is connected to a left terminal P1 by a conductive trace 115a, where the left terminal P1 serves as an input/output connection pad for signals, and is configured to connect to other circuits so as to transmit signals. A right terminal N of the inductance structure is connected to a lower electrode circuit of the capacitance structure located in the right-hand side of the space layer D, so as to form a series configuration.

The capacitance structure located in the right-hand side of the space layer D includes the combination of the microbump structures and the redistribution layers, in which the first redistribution layers 112b, 122b of the first substrates 110, 120 are utilized to respectively serve as an upper electrode and a lower electrode of the capacitance structure where one of the electrodes is a positive electrode and another one of the electrodes is a negative electrode. Moreover, the microbump structures 130 are configured to electrically insulate the upper and lower electrodes. The microbump structures 130 electrically connected to the first redistribution layer 122b are the anti-ring structures 113 contacting with the first substrate 110 when extending to the first substrate 110, so as to electrically insulate the first redistribution layer 112b. Similarly, the microbump structures 130 electrically connected to the first redistribution layer 112b are also the anti-ring structures contacting with the first substrate 120 when extending to the first substrate 120, so as to electrically insulate the first redistribution layer 122b. Additionally, the redistribution layers under the capacitance structure are connected to a right terminal P2 by a conductive trace 115b, where the right terminal P2 serves as an input/output connection pad for signals, and is configured to connect to other circuits so as to transmit signals.

The first redistribution layers 112, 122 and the microbump structures 130 are utilized in the chip stacking structure 100 to implement the combination of the impedance elements under the series configuration, although the disclosure is not limited thereto. The first redistribution layers and the microbump structures may also be utilized to implement the combination of the impedance elements under a parallel configuration.

Figure 3:
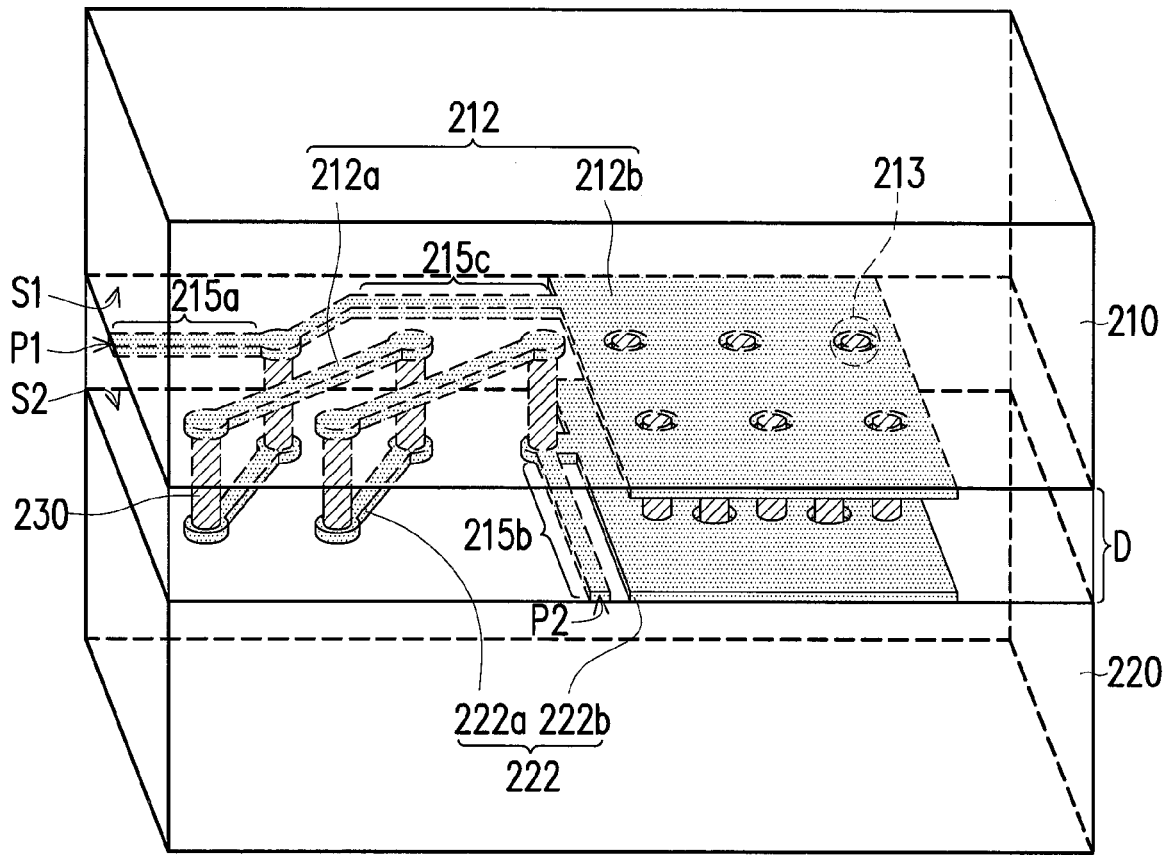
FIG. 3 is schematic diagram illustrating a chip stacking structure according to another embodiment of the disclosure.
Figure 4:
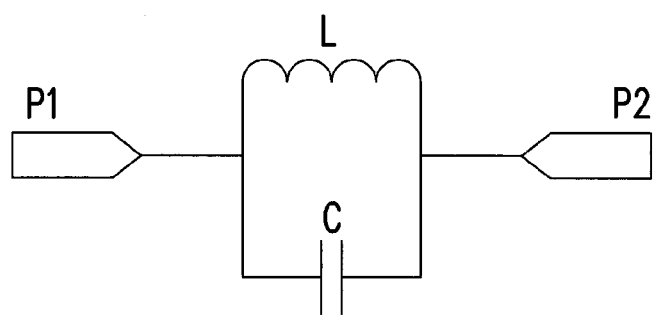
FIG. 4 is an equivalent circuit diagram illustrating the chip stacking structure depicted in FIG. 3.

FIG. 3 is schematic diagram illustrating a chip stacking structure according to another embodiment of the disclosure. FIG. 4 is an equivalent circuit diagram illustrating the chip stacking structure depicted in FIG. 3. Referring to FIG. 3 and FIG. 4 together, the chip stacking structure 200 of the embodiment is similar to the chip stacking structure 100 depicted in FIG. 1 except that the chip stacking structure 200 includes a set of the inductance element L and the capacitance element C connected in parallel, as shown in FIG. 4.

Specifically, similar to FIG. 1, the inductance structure located in the left-hand side of the space layer D is electrically connected to the redistribution layers 212a, 222a for the top and bottom layers of the inductance structure by the microbump structures 230, so as to form a helical inductance structure. Moreover, similar to FIG. 1, in the capacitance structure located in the right-hand side of the space layer D, the redistribution layers 212a, 222a respectively serve as an upper electrode and a lower electrode of a capacitor, and the anti-ring structures 213 of the microbump structures 230 are utilized to electrically insulate from each other, so as to form the capacitance structure. In the embodiment, the inductance structure is respectively connected to the upper electrode of the capacitor and the left terminal P1 by the conductive traces 215a, 215c, and the conductive trace 215b is utilized to wire from a location where the lower electrode of the capacitor is connected to the inductance structure to the terminal P2. The inductance element L and the capacitance element C form a parallel configuration through the afore-described layout of the conductive traces 215a, 215b, 215c.

In the two afore-described embodiments, the impedance elements are located in the same space layer between two substrates, and thus the inductance structure and the capacitance structure are the implementation of horizontal arrangement, although the disclosure is not limited thereto. In other embodiments, the impedance elements may also be vertically stacked to implement the combination of the impedance elements under the series or parallel configuration.

Figure 5:
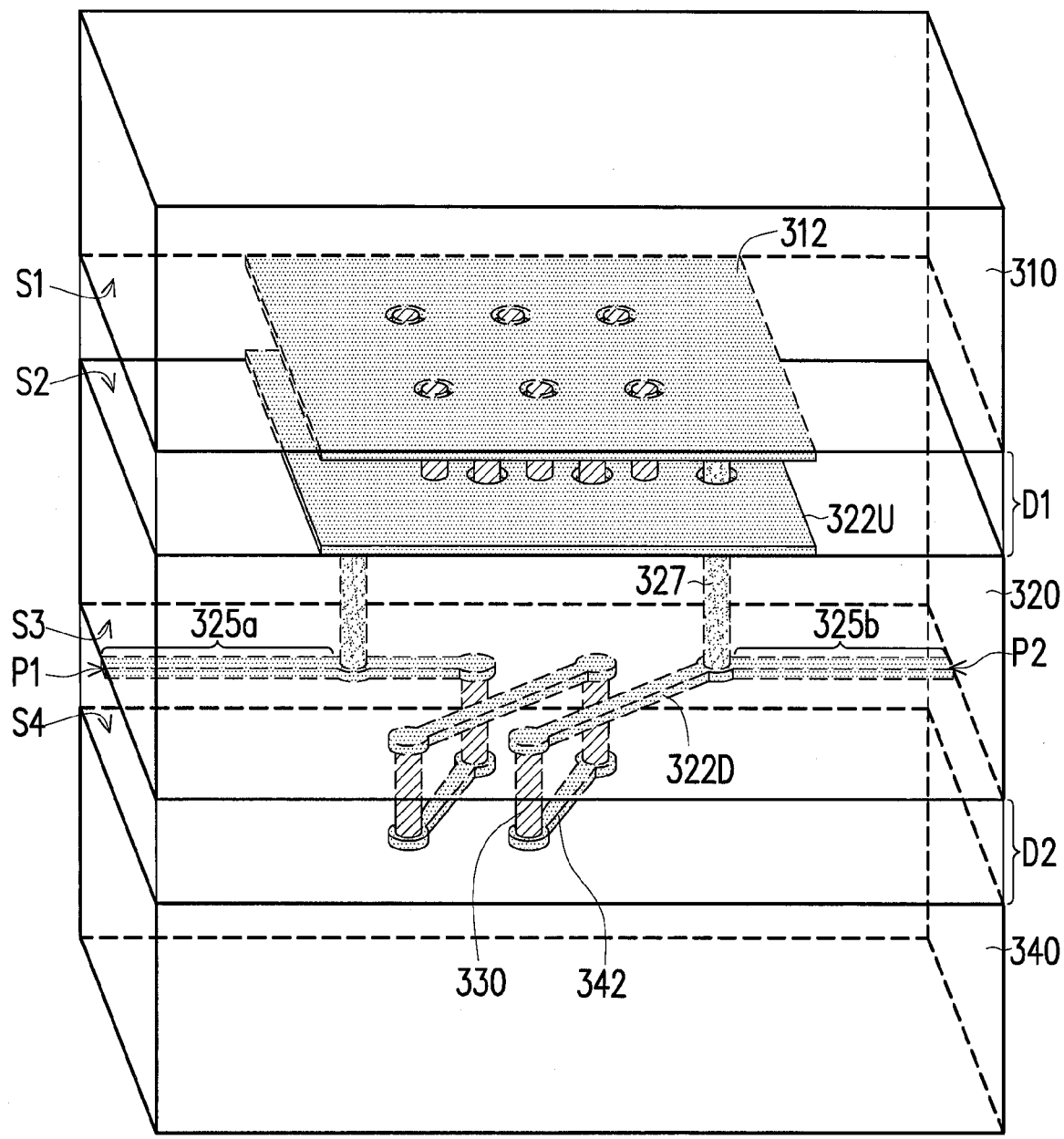
FIG. 5 is schematic diagram illustrating a chip stacking structure according to another embodiment of the disclosure.
Figure 6:
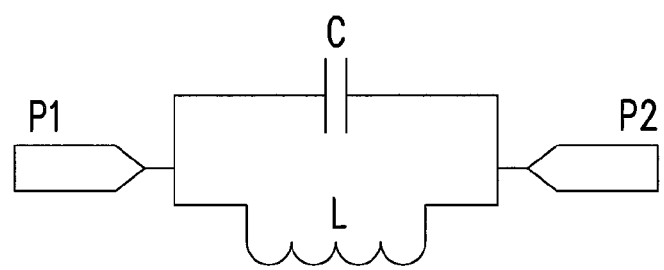
FIG. 6 is an equivalent circuit diagram illustrating the chip stacking structure depicted in FIG. 5.

FIG. 5 is schematic diagram illustrating a chip stacking structure according to another embodiment of the disclosure. FIG. 6 is an equivalent circuit diagram illustrating the chip stacking structure depicted in FIG. 5. Referring to FIG. 5 and FIG. 6, the chip stacking structure 300 includes a set of the inductance element L and the capacitance element C connected in parallel and vertically stacked, as shown in FIG. 6.

Specifically, referring to FIG. 5 and FIG. 6 together, the chip stacking structure 300 of the embodiment includes the plurality of first substrates 310, 320, 340 and the plurality of microbump structures 330. The first substrate 310 includes the first redistribution layer 312 which is disposed on the bottom surface S1 of the first substrate 310. The first substrate 320 includes the first redistribution layers 322U and 322D which are respectively disposed on the top surface S2 and the bottom surface S3 of the first substrate 320. The first substrate 340 includes the first redistribution layer 342 which is disposed on the top surface S4 of the first substrate 340. The microbump structures 330 are configured to connect the first redistribution layers 312, 322U, and are configured to connect the first redistribution layers 322D, 342, such that the three substrates are stably bonded, thereby enhancing the structural strength of the chip stacking structure 300. In the embodiment, the first redistribution layers 312, 322U and the microbump structures 330 form the capacitance structure in the space layer D1, and the first redistribution layers 322D, 342 and the microbump structures 330 form the inductance structure in the space layer D2. The capacitance structure and the inductance structure in the different space layers D1, D2 are electrically connected to each other by a conductive via 327 penetrating through the first substrate 320. Additionally, in the embodiment, the redistribution layers under the inductance structure are respectively connected to the left terminal P1 and the right terminal P2 (which serve as the input/output connection pads) by the conductive traces 325a, 325b. In another embodiment, the conductive traces 325a, 325b may also be respectively disposed on the first redistribution layers 312, 322U, so as to connect the upper and lower electrodes of the capacitance structure and the other two terminals. Therefore, in the embodiment, the impedance elements include a set of the inductance element L and the capacitance element C connected in parallel and vertically stacked on the circuit, as shown in FIG. 6. The set of impedance elements under the parallel configuration is capable of providing a specific oscillation frequency according to the setting of an inductance and a capacitance.

The first redistribution layers 312, 322U, 322D, 342 and the microbump structures 330 are utilized in the chip stacking structure 300 to implement the combination of the impedance elements vertically stacked under the parallel configuration, although the disclosure is not limited thereto. The first redistribution layers and the microbump structures may also be utilized to implement the combination of the impedance elements vertically stacked under the series configuration.

Figure 7:
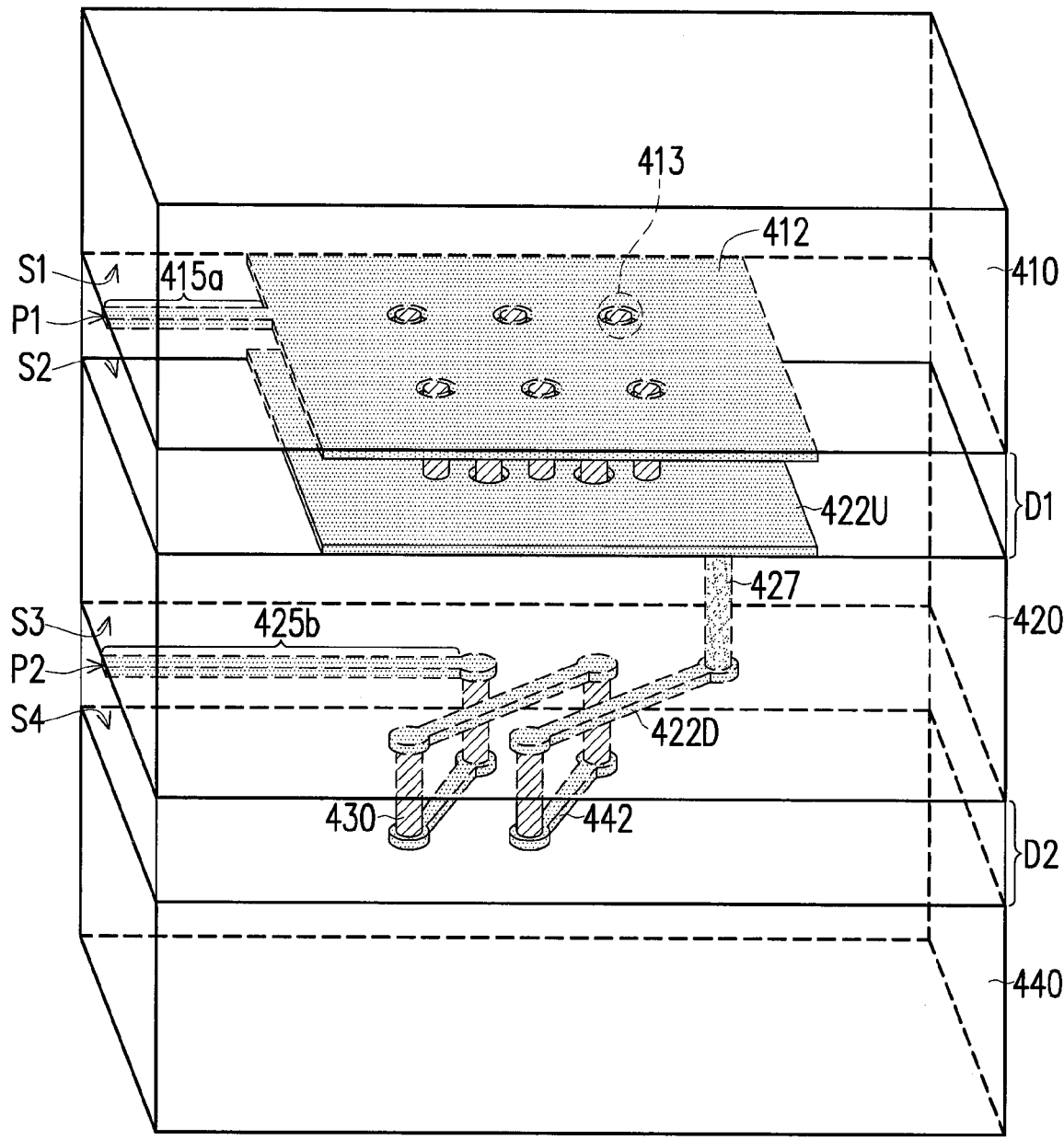
FIG. 7 is schematic diagram illustrating a chip stacking structure according to another embodiment of the disclosure.
Figure 8:
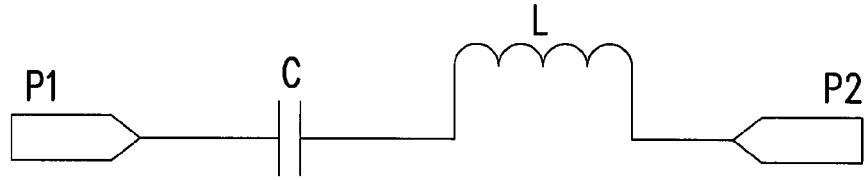
FIG. 8 is an equivalent circuit diagram illustrating the chip stacking structure depicted in FIG. 7.

FIG. 7 is schematic diagram illustrating a chip stacking structure according to another embodiment of the disclosure. FIG. 8 is an equivalent circuit diagram illustrating the chip stacking structure depicted in FIG. 7. Referring to FIG. 7 and FIG. 8 together, the chip stacking structure 400 of the embodiment is similar to the chip stacking structure 300 depicted in FIG. 5 except that the chip stacking structure 400 includes a set of the inductance element L and the capacitance element C connected in series and vertically stacked, as shown in FIG. 8.

Specifically, similar to FIG. 5, the inductance structure located in the space layer D2 is electrically connected to the redistribution layers 422D, 442 for the top and bottom layers of the inductance structure by the microbump structures 430, so as to form a helical inductance structure. Moreover, similar to FIG. 5, in the capacitance structure located in the space layer D1, the redistribution layers 412, 422U respectively serve as an upper electrode and a lower electrode of a capacitor, and the anti-ring structures 413 of the microbump structures 430 are utilized to electrically insulate from each other, so as to form the capacitance structure. In the embodiment, the upper electrode of the capacitance structure is wired to the terminal P1 by the conductive trace 415a, and the redistribution layer 422D for the top layer of the inductance structure is electrically connected to the terminal P2 by the conductive trace 425b. The inductance element L and the capacitance element C form the series configuration through the afore-described layout of the conductive traces 415a, 415b.

In the two afore-described embodiments, the impedance elements are located in the different space layers between the different substrates, and thus the inductance structure and the capacitance structure are the implementation of vertically stacked, although the disclosure is not limited thereto. In other embodiments, the impedance elements may also be the integration of being horizontally arranged and being vertically stacked, so as to implement the combination of the impedance elements under both the series and parallel configurations.

For example, a chip stacking structure may include a plurality of microbump structures, a plurality of first substrates and a plurality of second substrates. The first substrates are stacked upon each other by the microbump structures, and each of the first substrates includes at least one first redistribution layer. The second substrates are stacked on at least one of the first substrates by the microbump structures, and each of the second substrates includes at least one second redistribution layer. The first redistribution layers, the second redistribution layers and the microbump structures form a plurality of impedance elements.

Figure 9:
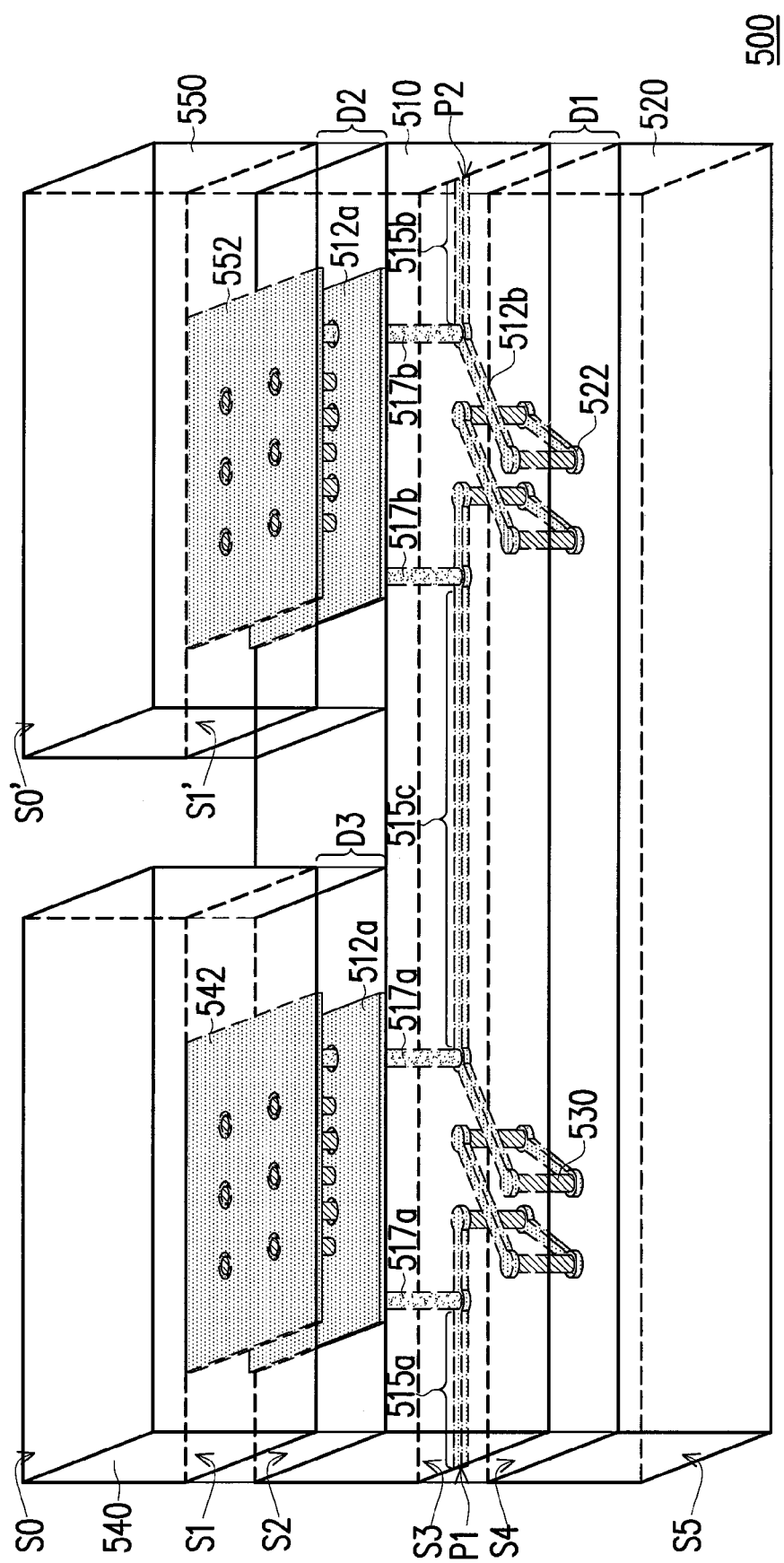
FIG. 9 is schematic diagram illustrating a chip stacking structure according to another embodiment of the disclosure.
Figure 10:
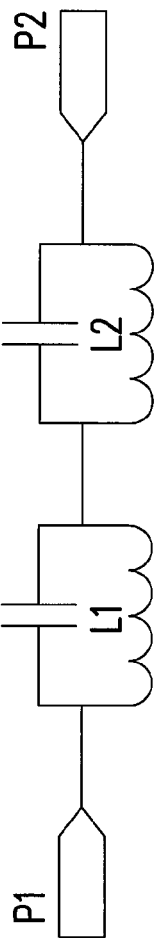
FIG. 10 is an equivalent circuit diagram illustrating the chip stacking structure depicted in FIG. 9.

Specifically, FIG. 9 is schematic diagram illustrating a chip stacking structure according to another embodiment of the disclosure. FIG. 10 is an equivalent circuit diagram illustrating the chip stacking structure depicted in FIG. 9. Referring to FIG. 9 and FIG. 10 together, in the embodiment, the first substrates of the chip stacking structure 500 include a third substrate 520 and a fourth substrate 510, and the second substrates of the chip stacking structure 500 include a fifth substrate 540 and a sixth substrate 550.

To be further specified, the third substrate 520 has a first surface S4 and a second surface S5 opposite to each other. The first redistribution layer 522 of the third substrate 520 is disposed on the first surface S4 of the third substrate 520. The fourth substrate 510 is stacked on the third substrate 520 by the microbump structures 530, and has a first surface S2 and a second surface S3 opposite to each other. The first redistribution layers 512a, 512b of the fourth substrate 510 are disposed on the first surface S2 and the second surface S3 of the fourth substrate 510, respectively. In the embodiment, the first redistribution layer 512b disposed on the second surface S3 of the fourth substrate 510 and the first redistribution layer 522 disposed on the first surface S4 of the third substrate 520 form two helical inductance structures by the microbump structures 530, where the two helical inductance structures are located in the left-hand side and the right-hand side of the space layer D1, respectively. The two inductance structures are connected in series by the conductive trace 515c on the first redistribution layer 512b of the second surface S3 of the fourth substrate 510. Moreover, the two inductance structures located in the left and right-hand sides of the space layer D1 are respectively connected to the left and right terminals P1, P2 by the conductive traces 515a, 515b, so as to serve as the input/output connection pads for signals. In another embodiment, the layout of the conductive traces 515a, 515b, 515c may also be modified according to the actual design requirement, so that the two inductance structures are connected in parallel. Additionally, in another embodiment, the two inductance structures located in the space layer D1 may also be connected in series or in parallel by the conductive trace (not shown) on the first redistribution layer 522 of the first surface S4 of the third substrate 520.

On the other hand, in the embodiment, the fifth substrate 540 is stacked on the fourth substrate 510 by the microbump structures 530, and has a first surface S0 and a second surface S1 opposite to each other. The second redistribution layer 542 of the fifth substrate 540 is disposed on the second surface S1 of the fifth substrate 540. The sixth substrate 550 is stacked on the fourth substrate 510 by the microbump structures 530, and has a first surface S0' and a second surface S1' opposite to each other. The second redistribution layer 552 of the sixth substrate 550 is disposed on the second surface S1' of the sixth substrate 550. In the embodiment, the second redistribution layer 542 disposed on the second surface S1 of the fifth substrate 540 and the first redistribution layer 512a disposed on the first surface S2 of the fourth substrate 510 form a capacitance element C1 by the microbump structures 530. The capacitance element C1 is connected in parallel to an inductance element L1 by the conductive via 517a penetrating through the fourth substrate 510. The capacitance element C1 and the inductance element L1 may also be connected in series with a different layout. Additionally, the second redistribution layer 552 disposed on the second surface S1' of the sixth substrate 550 and the first redistribution layer 512a disposed on the first surface S2 of the fourth substrate 510 form a capacitance element C2 by the microbump structures 530. The capacitance element C2 is connected in parallel to an inductance element L2 by the conductive via 517b penetrating through the fourth substrate 510. The capacitance element C2 and the inductance element L2 may also be connected in series with a different layout. In the embodiment, the capacitance elements C1 and C2 are connected in series by the conductive vias 517a, 517b penetrating through the fourth substrate and the conductive trace 515c. Alternatively, in another embodiment, the capacitance elements C1 and C2 may also be connected in series by the conductive trace (not shown) on the first redistribution layer 522 of the first surface S4 of the third substrate 520. Additionally, the capacitance elements C1 and C2 may also be connected in parallel with a different layout, according to the actual design requirements.

From another perspective, the chip stacking structure 500 depicted in FIG. 9 may also be regarded as the combination of two of the chip stacking structures 300 depicted in FIG. 5, in which the two inductance structures located in the space layer D1 are arranged horizontally, and share the first redistribution layer 522 of the third substrate 520 and the first redistribution layer 512b of the fourth substrate 510. Subsequently, the two capacitance structures located in the space layers D2 and D3 are respectively disposed directly on the two inductance structures located in the left and right-hand sides of the space layer D1, in the vertically stacking manner. Moreover, the two capacitance structures located in the space layers D2 and D3 are electrically connected to the inductance structures by the conductive vias.

In the disclosure, the capacitance structure or the inductance structure may also be formed by the layout such as utilizing the redistribution layers, the microbump structures, the conductive vias and the wire bonding structures, between the second substrates of the chip stacking structure.

Figure 11:
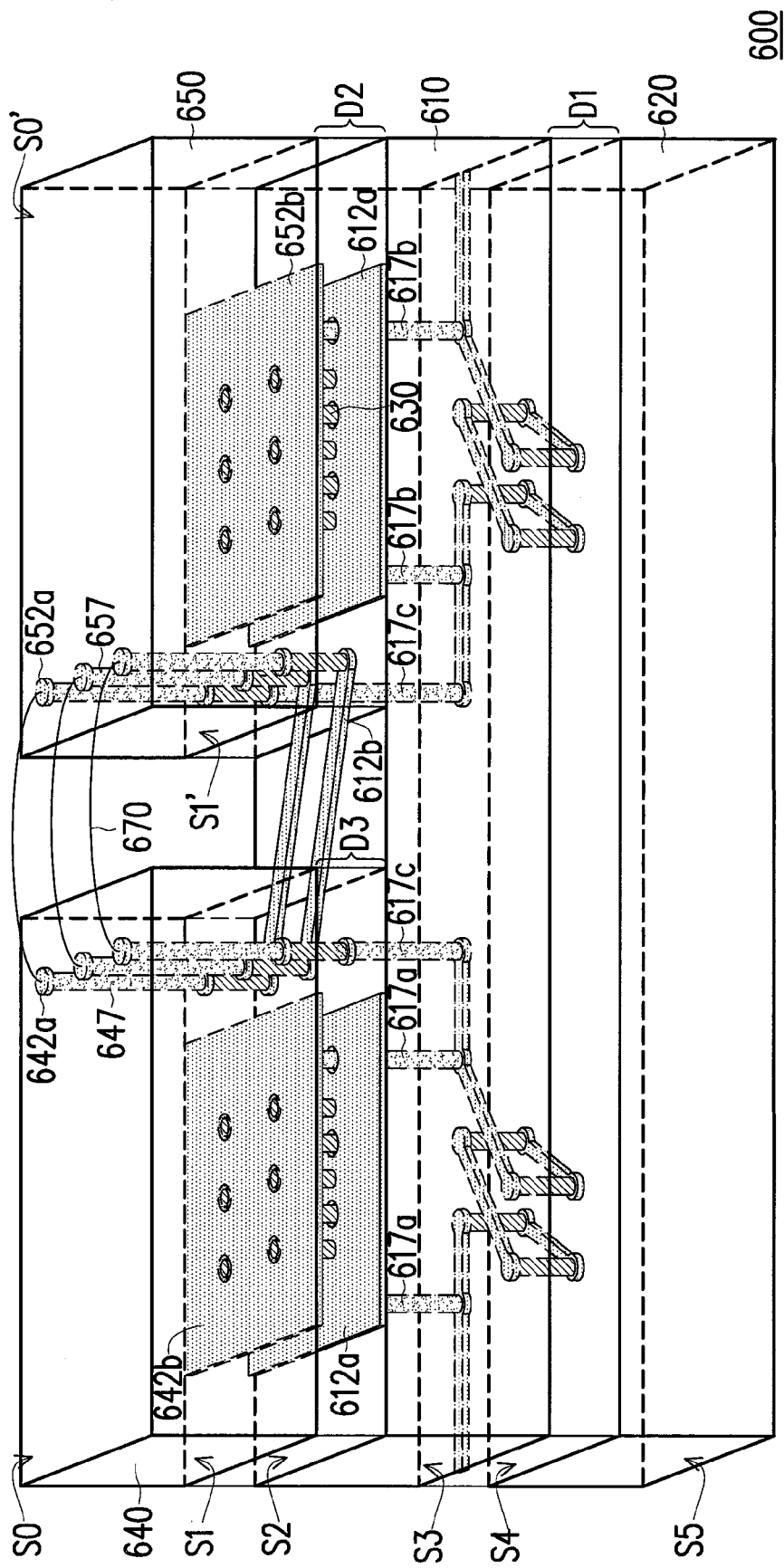
FIG. 11 is schematic diagram illustrating a chip stacking structure according to another embodiment of the disclosure.
Figure 12:
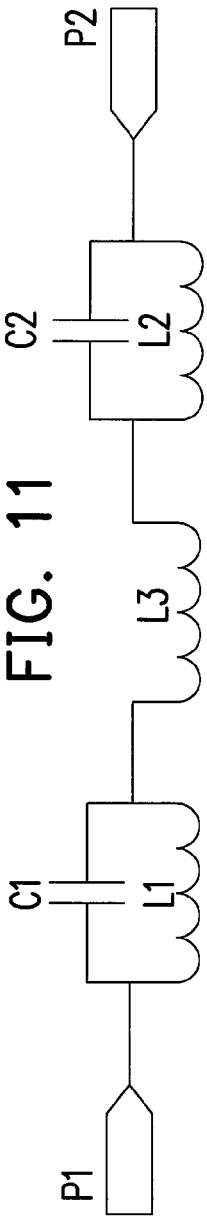
FIG. 12 is an equivalent circuit diagram illustrating the chip stacking structure depicted in FIG. 11.

FIG. 11 is schematic diagram illustrating a chip stacking structure according to another embodiment of the disclosure. FIG. 12 is an equivalent circuit diagram illustrating the chip stacking structure depicted in FIG. 11. Referring to FIG. 11 and FIG. 12 together, the chip stacking structure 600 of the embodiment is similar to the chip stacking structure 500 depicted in FIG. 9 except that the chip stacking structure 600 includes an inductance structure between the second substrates, in which the inductance structure in the equivalent circuit diagram is the inductance element L3 coupled between the two sets of the inductance elements and the capacitance elements under the parallel configuration, as shown in FIG. 12.

Specifically, in the embodiment, the second substrates of the chip stacking structure 600 include a seventh substrate 640 and an eighth substrate 650. The seventh substrate 640 is stacked on the fourth substrate 610 by the microbump structures 630, and has a first surface S0 and a second surface S1 opposite to each other. The second redistribution layers 642a and 642b of the seventh substrate 640 are disposed on the first surface S0 and the second surface S1 of the seventh substrate 640, respectively. The eighth substrate 650 is stacked on the fourth substrate 610 by the microbump structures 630, and has a first surface S0' and a second surface S1' opposite to each other. The second redistribution layers 652a and 652b of the eighth substrate 650 are disposed on the first surface S0' and the second surface S1' of the eighth substrate 650, respectively. In the embodiment, the second redistribution layer 642b and the first redistribution layer 612a form the capacitance element C1 by the microbump structures 630. The capacitance element C1 is connected in parallel to the inductance element L1 by the conductive via 617a penetrating through the fourth substrate 610, although the disclosure is not excluded the implementation that the two elements are connected in series. In the embodiment, the capacitance element C1 is connected in parallel to the inductance element L1. Additionally, the second redistribution layer 652b and the first redistribution layer 612a form the capacitance element C2 by the microbump structures 630. The capacitance element C2 is connected in parallel to the inductance element L2 by the conductive via 617b penetrating through the fourth substrate 610, although the disclosure is not excluded the implementation that the two elements are connected in series.

In the embodiment, the chip stacking structure 600 further includes a plurality of wire bonding structures 670. The wire bonding structures 670 are connected to the second redistribution layer 642a of the first surface S0 of the seventh substrate 640 and the second redistribution layer 652a of the first surface S0' of the eighth substrate 650. The second redistribution layer 642a disposed on the first surface S0 of the seventh substrate 640 is connected to the second redistribution layer 642b disposed on the second surface S1 by the conductive via 647 penetrating through the seventh substrate 640. The second redistribution layer 652a disposed on the first surface S0' of the eighth substrate 650 is connected to the second redistribution layer 652b disposed on the second surface S1' by the conductive via 657 penetrating through the eighth substrate 650. Therefore, in the embodiment, the wire bonding structures 670, the conductive trace 612b of the fourth substrate 610, the second redistribution layers 642a, 652a, the conductive vias 647, 657 and the microbump structures 630 connecting to the seventh substrate 640, the eighth substrate 650 and the fourth substrate 610, form the inductance element L3 between the seventh substrate 640 and the eighth substrate 650, according to the afore-described layout. In another embodiment, a material with high permeability is further included between the seventh substrate 640 and the eighth substrate 650, so as to enhance the inductance of the inductance element L3.

Additionally, in another embedment, the capacitance structure may also be formed by the layout such as utilizing the redistribution layers, the microbump structures, the conductive vias and the wire bonding structures, between the second substrates of the chip stacking structure of the disclosure.

Figure 13:
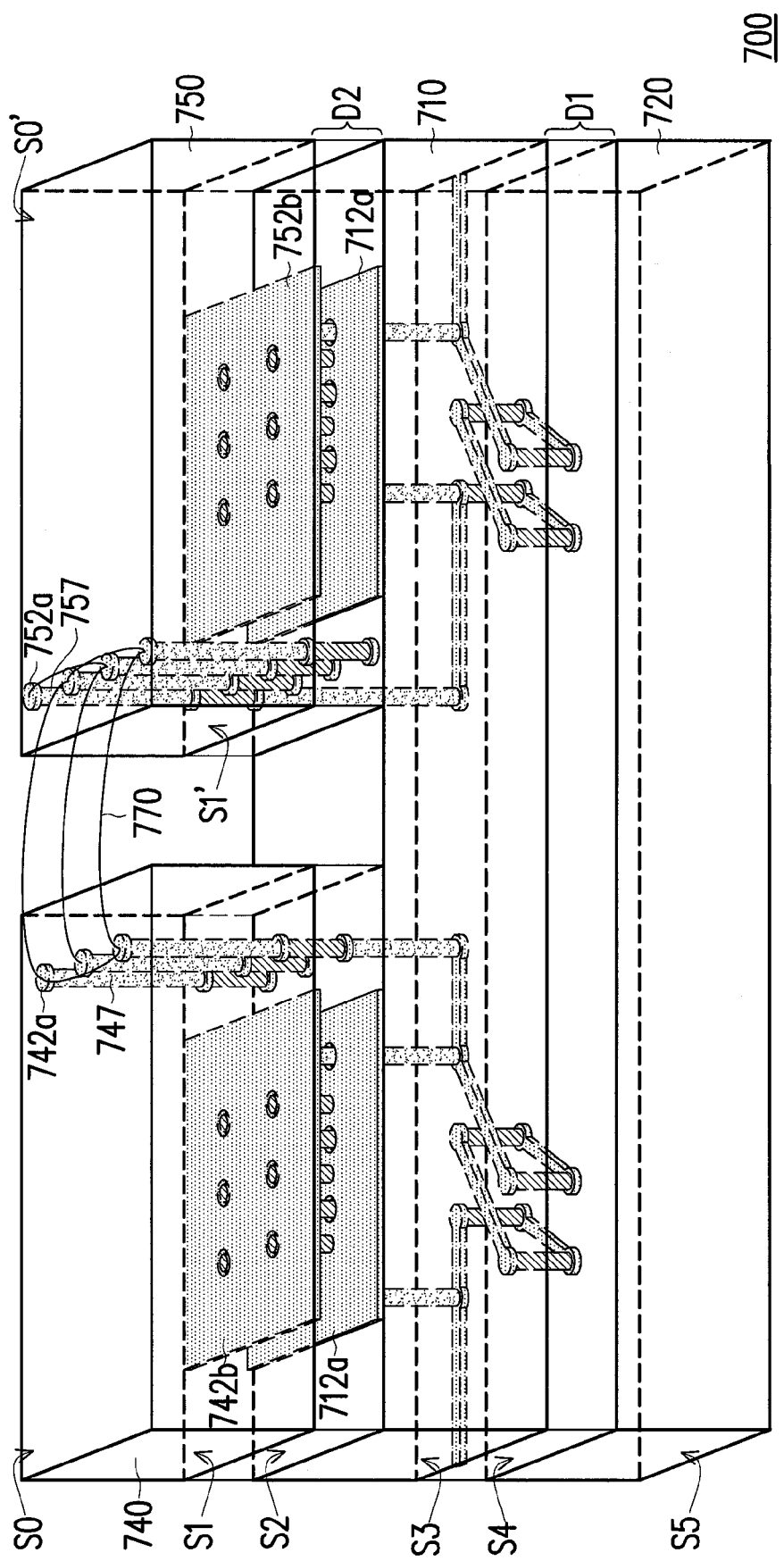
FIG. 13 is schematic diagram illustrating a chip stacking structure according to another embodiment of the disclosure.
Figure 14:
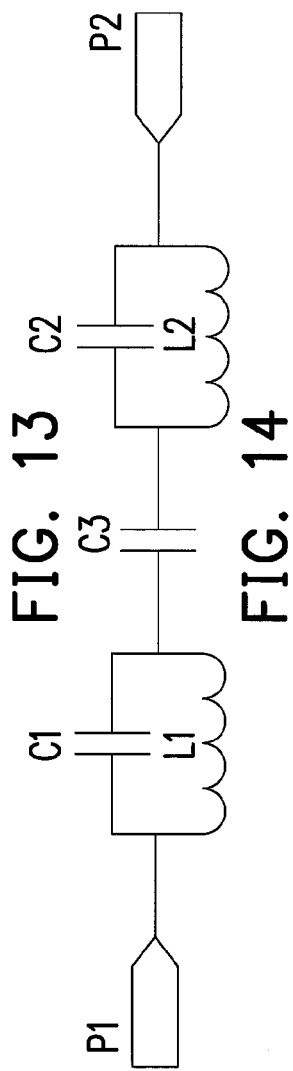
FIG. 14 is an equivalent circuit diagram illustrating the chip stacking structure depicted in FIG. 13.

FIG. 13 is schematic diagram illustrating a chip stacking structure according to another embodiment of the disclosure. FIG. 14 is an equivalent circuit diagram illustrating the chip stacking structure depicted in FIG. 13. Referring to FIG. 13 and FIG. 14 together, the chip stacking structure 700 of the embodiment is similar to the chip stacking structure 600 depicted in FIG. 11 except that the chip stacking structure 700 includes a capacitance structure between the second substrates, in which the capacitance structure in the equivalent circuit diagram is the capacitance element C3 coupled between the two sets of the inductance elements and the capacitance elements under the parallel configuration, as shown in FIG. 14. The layout between the seventh substrate 740 and the eighth substrate 750 may be adjusted corresponding to the capacitance structure between the second substrates.

Specifically, in the embodiment, the wire bonding structures 770 are connected to the second redistribution layer 742a of the seventh substrate 740 and the second redistribution layer 752a of the eighth substrate 750. The second redistribution layer 742a of the seventh substrate 740 is connected to the second redistribution layer 742b by the conductive via 747 penetrating through the seventh substrate 740. The second redistribution layer 752a of the eighth substrate 750 is connected to the second redistribution layer 752b by the conductive via 757 penetrating through the eighth substrate 750. Therefore, in the embodiment, the wire bonding structures 770, the second redistribution layers 742a, 752a, the conductive vias 747, 757 and the microbump structures 730 connecting to the seventh substrate 740, the eighth substrate 750 and the fourth substrate 710, form the capacitance element C3 between the seventh substrate 740 and the eighth substrate 750, according to the afore-described layout. In another embodiment, a material with high dielectric constant is further included between the seventh substrate 740 and the eighth substrate 750, so as to enhance the capacitance of the capacitance element C3.

The implementation of the capacitance element in the chip stacking structure of the disclosure is further illustrated in detail as follows.

Figure 15:
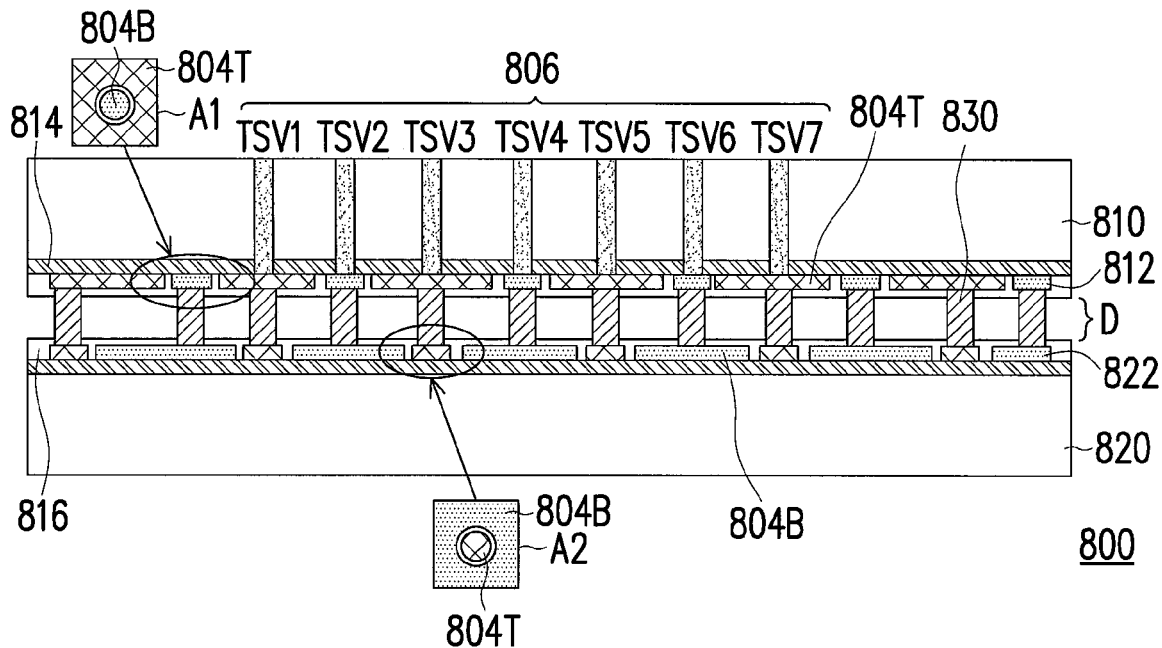
FIG. 15 is schematic diagram illustrating a chip stacking structure of a capacitance element according to an embodiment of the disclosure.

FIG. 15 is schematic diagram illustrating a chip stacking structure of a capacitance element according to an embodiment of the disclosure. Referring to FIG. 15, the chip stacking structure 800 of the embodiment includes the first substrate 810, the second substrate 820 and the microbump structures 830. The redistribution layers 812 and 822 are respectively disposed on the bottom surface of the first substrate 810 and the top surface of the second substrate 820, and the redistribution layers 812, 822 are separated from the first substrate 810 and the second substrate 820 by an insulating layer 814. In the embodiment, a portion of the redistribution patterns of the redistribution layers 812, 822 serves as the upper electrode 804T of the capacitance structure, whereas another portion of the redistribution patterns serves as the lower electrode 804B of the capacitance structure. The redistribution patterns of the redistribution layers 812, 822 combined by the microbump structures 830 are capable of electrically insulating the upper and lower electrodes 804T, 804B of the capacitance structure. Moreover, the space layer D may be filled with the insulating material to serve as the dielectric material of the capacitance element.

For example, it is indicated in the wiring region A1 that the upper electrode 804T and the lower electrode 804B are electrically insulated by the anti-ring structure in the chip stacking structure 800. In such region, the upper electrode 804T is surrounded by the lower electrode 804B of the capacitance structure, and the insulating material of a passivation layer 816 is filled between the two electrodes so as to form the configuration being electrically insulated. Similarly, it is indicated in the wiring region A2 that the upper electrode 804T and the lower electrode 804B are also electrically insulated by the anti-ring structure in the chip stacking structure 800 except that the lower electrode 804B is surrounded by the upper electrode 804T of the capacitance structure in such region.

Moreover, in the embodiment, the redistribution layer 812 is connected to the upper electrode 804T, the lower electrode 804B of the capacitance structure and other electronic elements in the chip stacking structure 800 by the conductive vias 806, so as to transmit signals. Moreover, the upper electrode 804T and the lower electrode 804B of the capacitance structure may be selected arbitrarily to serve as the positive electrode or the negative electrode, according to the different application requirements. For instance, the upper electrode 804T may be served as the positive electrode and the positive power source may be biased by the conductive vias TSV1, TSV3, TSV5, TSV7, whereas the lower electrode 804B may be served as the negative electrode and the negative power source may be biased by the conductive vias TSV2, TSV4, TSV6.

Figure 16:
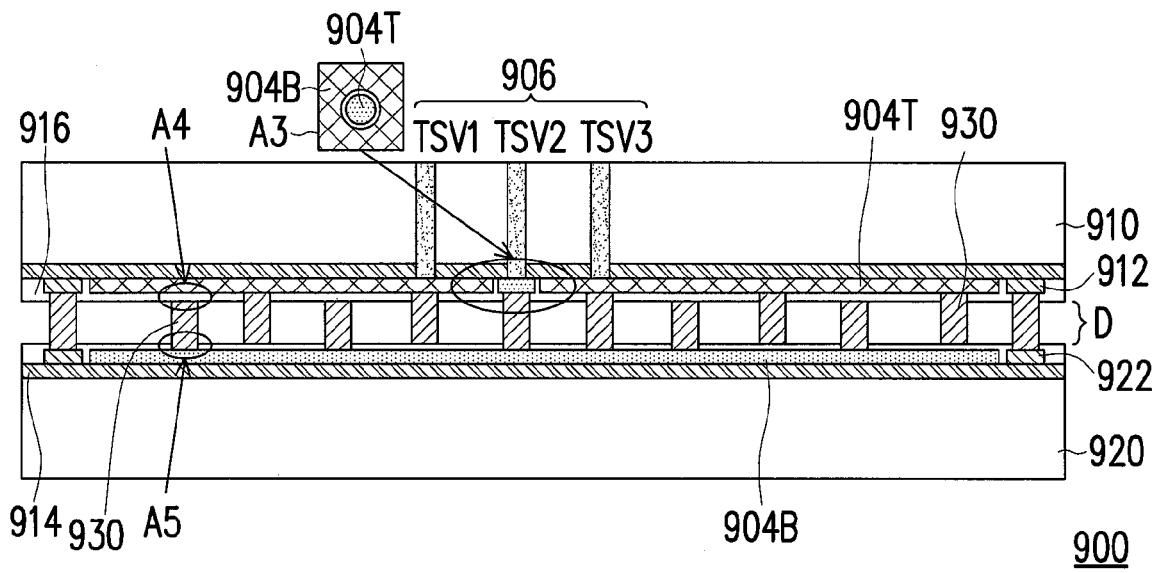
FIG. 16 is schematic diagram illustrating a chip stacking structure of a capacitance element according to another embodiment of the disclosure.

FIG. 16 is schematic diagram illustrating a chip stacking structure of a capacitance element according to another embodiment of the disclosure. Referring to FIG. 16, the chip stacking structure 900 of the embodiment is similar to the chip stacking structure 800 depicted in FIG. 15 except that the redistribution layer 912 disposed on the bottom surface of the first substrate 910 and the redistribution layer 922 disposed on the top surface of the second substrate 920 are respectively regarded as the upper electrode 904T and the lower electrode 904B of the capacitance structure in the chip stacking structure 900.

In the embodiment, the microbump structures 930 are disposed between the first substrate 910 and the second substrate 920, in which the connecting method thereof to the redistribution layers 912, 922 of the two substrates includes a passivation open configuration and a passivation close configuration. As shown in the region A5, the bottom end of the microbump structure 930 in the region A5 is electrically connected to the lower electrode 904B directly under the passivation open configuration. Contrarily, as shown in the region A4, the top end of the microbump structure 930 and the upper electrode 904T are separated by the passivation layer 916 therebetween, so that the two elements are electrically insulated from each other to form the passivation close configuration.

Moreover, in the embodiment, the redistribution layers 912 and 922 are connected to the upper electrode 904T, the lower electrode 904B of the capacitance structure and other electronic elements in the chip stacking structure 900 by the conductive vias 906, so as to transmit signals. For the lower electrode 904B, the conductive via TSV2 is configured to output an electrical signal of the lower electrode 904B to other electronic elements, and the anti-ring structure of the region A3 is configured to electrically insulate the upper and lower electrodes 904T, 904B. For instance, in the embodiment, the lower electrode 904B may be served as the positive electrode and the positive power source may be biased by the conductive via TSV2, whereas the upper electrode 904T may be served as the negative electrode and the negative power source may be biased by the conductive vias TSV1 and TSV3. Moreover, in the embodiment, the locations of the conductive via TSV2 and the anti-ring structure of the region A3 may be distributed at arbitrary positions of the bottom surface of the first substrate 910.

Moreover, the capacitance structure disclosed by FIG. 15 and FIG. 16 may also be applied to the chip stacking structure depicted in FIG. 1 to FIG. 14, where the implementation may be obtained from the embodiments depicted in FIG. 1 to FIG. 14 which are sufficient in teaching, suggesting and illustrating, and thus the detailed description thereof will be omitted herein.

In summary, the chip stacking structure of the disclosure includes the plurality of three-dimensional winding impedance elements formed by the microbump structures, the conductive vias and the chips stacked in layers, and the impedance elements are electrically connected to each other so as to maintain fine electrical properties. Moreover, the three-dimensional winding impedance elements in the chip stacking structure of the disclosure may also be formed by using the wiring structures, and the material with high dielectric constant or the material with high permeability may be filled between the substrates to enhance the capacitance or the inductance of the impedance elements.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip stacking structure, comprising:
   a plurality of microbump structures;
   a plurality of first substrates, stacked upon each other by a first part of the microbump structures, and each of the first substrates comprises at least one first redistribution layer;
   at least one first space layer, located between the first substrates, wherein the first part of the microbump structures is disposed in the at least one first space layer, and is configured to connect the at least one first redistribution layer of the first substrates;
   a plurality of second substrates, stacked on at least one of the first substrates by a second part of the microbump structures, and each of the second substrates comprises at least one second redistribution layer; and
   at least one second space layer, located between the first substrates and the second substrates, wherein the second part of the microbump structures is disposed in the at least one second space layer, and is configured to connect the at least one first redistribution layer of the first substrates and the at least one second redistribution layer of the second substrates,
   wherein the first redistribution layers, the second redistribution layers and the microbump structures form a plurality of impedance elements, and the impedance elements provide a specific oscillation frequency.

2. The chip stacking structure according to claim 1, wherein the first substrates comprise:
   a third substrate, having a first surface and a second surface opposite to each other, wherein the first redistribution layer of the third substrate is disposed on the first surface of the third substrate; and
   a fourth substrate, stacked on the third substrate by the first part of the microbump structures, and having a third surface and a fourth surface opposite to each other, wherein the first redistribution layers of the fourth substrate are respectively disposed on the third surface and the fourth surface of the fourth substrate,
   wherein the first redistribution layer disposed on the fourth surface of the fourth substrate and the first redistribution layer disposed on the first surface of the third substrate form at least one first impedance element of the impedance elements by the first part of the microbump structures.

3. The chip stacking structure according to claim 2, wherein the first impedance elements are connected in series or in parallel by a first conductive trace on the first redistribution layer of the fourth surface of the fourth substrate or a second conductive trace on the first redistribution layer of the first surface of the third substrate.

4. The chip stacking structure according to claim 2, wherein the first redistribution layer disposed on the third surface of the fourth substrate is connected to the first redistribution layer disposed on the fourth surface of the fourth substrate by at least one conductive via penetrating through the fourth substrate.

5. The chip stacking structure according to claim 2, wherein the second substrates comprise:
   a fifth substrate, stacked on the fourth substrate by the second part of the microbump structures, and having a fifth surface and a sixth surface opposite to each other, wherein the second redistribution layer of the fifth substrate is disposed on the sixth surface of the fifth substrate; and
   a sixth substrate, stacked on the fourth substrate by the second part of the microbump structures, and having a seventh surface and an eighth surface opposite to each other, wherein the second redistribution layer of the sixth substrate is disposed on the eighth surface of the sixth substrate,
   wherein the second redistribution layer disposed on the sixth surface of the fifth substrate and the first redistribution layer disposed on the third surface of the fourth substrate form at least one second impedance element of the impedance elements by the second part of the microbump structures, and
   wherein the second redistribution layer disposed on the eighth surface of the sixth substrate and the first redistribution layer disposed on the third surface of the fourth substrate form at least one third impedance element of the impedance elements by the second part of the microbump structures.

6. The chip stacking structure according to claim 5, wherein the at least one second impedance element is connected in series or in parallel to the at least one first impedance element by at least one conductive via penetrating through the fourth substrate.

7. The chip stacking structure according to claim 5, wherein the at least one third impedance element is connected in series or in parallel to the at least one first impedance element by at least one conductive via penetrating through the fourth substrate.

8. The chip stacking structure according to claim 5, wherein the at least one second impedance element and the at least one third impedance element are connected in series or in parallel by at least one conductive via penetrating through the fourth substrate, and a first conductive trace on the first redistribution layer of the fourth surface of the fourth substrate or a second conductive trace on the first redistribution layer of the first surface of the third substrate.

9. The chip stacking structure according to claim 2, wherein the second substrates comprise:
   a seventh substrate, stacked on the fourth substrate by the second part of the microbump structures, and having a ninth surface and a tenth surface opposite to each other, wherein the second redistribution layers of the seventh substrate are respectively disposed on the ninth surface and the tenth surface of the seventh substrate; and
   an eighth substrate, stacked on the fourth substrate by the second part of the microbump structures, and having a eleventh surface and a twelfth surface opposite to each other, wherein the second redistribution layers of the eighth substrate are respectively disposed on the eleventh surface and the twelfth surface of the eighth substrate,
   wherein the second redistribution layer disposed on the tenth surface of the seventh substrate and the first redistribution layer disposed on the third surface of the fourth substrate form at least one fifth impedance element of the impedance elements by the second part of the microbump structures, and
   wherein the second redistribution layer disposed on the twelfth surface of the eighth substrate and the first redistribution layer disposed on the third surface of the fourth substrate form at least one sixth impedance element of the impedance elements by the second part of the microbump structures.

10. The chip stacking structure according to claim 9, wherein the at least one fifth impedance element is connected in series or in parallel to the at least one first impedance element by at least one conductive via penetrating through the fourth substrate.

11. The chip stacking structure according to claim 9, wherein the at least one sixth impedance element is connected in series or in parallel to the at least one first impedance element by at least one conductive via penetrating through the fourth substrate.

12. The chip stacking structure according to claim 9, further comprising:
   a plurality of wire bonding structures, connected to the second redistribution layer of the ninth surface of the seventh substrate and the second redistribution layer of the eleventh surface of the eighth substrate.

13. The chip stacking structure according to claim 12, wherein the second redistribution layer disposed on the ninth surface of the seventh substrate is connected to the second redistribution layer disposed on the tenth surface of the seventh substrate by at least one conductive via penetrating through the seventh substrate, and the second redistribution layer disposed on the eleventh surface of the eighth substrate is connected to the second redistribution layer disposed on the twelfth surface of the eighth substrate by the at least one conductive via penetrating through the eighth substrate.

14. The chip stacking structure according to claim 13, wherein the wire bonding structures, the second redistribution layers of the seventh substrate and the eighth substrate, the conductive vias penetrating through the seventh substrate and the eighth substrate, and the second part of the microbump structures connecting to the fourth substrate, the seventh substrate and the eighth substrate form at least one seventh impedance element of the impedance elements.

15. The chip stacking structure according to claim 14, wherein a material with high dielectric constant is further comprised between the seventh substrate and the eighth substrate, so as to enhance a capacitance of the at least one seventh impedance element.

16. The chip stacking structure according to claim 13, wherein the wire bonding structures, a conductive trace on the first redistribution layer of the third surface of the fourth substrate, the second redistribution layers of the seventh substrate and the eighth substrate, the conductive vias penetrating through the seventh substrate and the eighth substrate, and the second part of the microbump structures connecting to the fourth substrate, the seventh substrate and the eighth substrate form at least one eighth impedance element of the impedance elements.

17. The chip stacking structure according to claim 16, wherein a material with high permeability is further comprised between the seventh substrate and the eighth substrate, so as to enhance an inductance of the at least one eighth impedance element.

* * * * *